United States Patent
Zhang et al.

(10) Patent No.: US 11,271,579 B2
(45) Date of Patent: Mar. 8, 2022

(54) COMPARATOR CIRCUIT APPLICABLE TO HIGH-SPEED PIPELINE ADC

(71) Applicant: CHINA ELECTRONIC TECHNOLOGY CORPORATION, 24TH RESEARCH INSTITUTE, Chongqing (CN)

(72) Inventors: Yong Zhang, Chongqing (CN); Ting Li, Chongqing (CN); Zheng-Bo Huang, Chongqing (CN); Ya-Bo Ni, Chongqing (CN); Dong-Bing Fu, Chongqing (CN)

(73) Assignee: CHINA ELECTRONIC TECHNOLOGY CORPORATION, 24TH RESEARCH INSTITUTE, Chongqing (CN)

(*) Notice: Subject to any disclaimer, the term of this patent is extended or adjusted under 35 U.S.C. 154(b) by 540 days.

(21) Appl. No.: 16/333,189

(22) PCT Filed: Mar. 1, 2018

(86) PCT No.: PCT/CN2018/077700
§ 371 (c)(1),
(2) Date: Mar. 13, 2019

(87) PCT Pub. No.: WO2019/148571
PCT Pub. Date: Aug. 8, 2019

(65) Prior Publication Data
US 2021/0376847 A1 Dec. 2, 2021

(30) Foreign Application Priority Data
Feb. 1, 2018 (CN) .......................... 201810103112.8

(51) Int. Cl.
*H03M 1/12* (2006.01)
*H03M 1/16* (2006.01)
*H03M 1/34* (2006.01)

(52) U.S. Cl.
CPC ........... *H03M 1/124* (2013.01); *H03M 1/164* (2013.01); *H03M 1/34* (2013.01)

(58) Field of Classification Search
CPC ......... H03M 1/124; H03M 1/164; H03M 1/34
USPC ........................................................ 341/161
See application file for complete search history.

(56) References Cited

U.S. PATENT DOCUMENTS 7,903,017 B2 * 3/2011 Hsieh ................... H03M 1/1245
341/161
8,446,307 B2 * 5/2013 Johansson ............ H03K 5/2481
341/155
2015/0137854 A1 5/2015 Li et al.

FOREIGN PATENT DOCUMENTS

| CN | 103178852 A | 6/2013 |
| CN | 103248365 A | 8/2013 |
| CN | 103546127 A | 1/2014 |

(Continued)

*Primary Examiner* — Khai M Nguyen
(74) *Attorney, Agent, or Firm* — Cheng-Ju Chiang

(57) ABSTRACT

The present invention provides a comparator circuit applicable to a high-speed pipeline ADC. The comparator circuit includes a switch capacitor circuit, a pre-amplification circuit, and a latch circuit. The pre-amplification circuit includes a pre-amplifier, a resistance-adjustable device, two switches. The latch circuit includes a differential static latch, a first capacitor, a second capacitor, and a third switch. The transmission rates of a sampling phase and a setup phase can be increased.

16 Claims, 9 Drawing Sheets

(56) References Cited

FOREIGN PATENT DOCUMENTS

CN 104300983 A 1/2015
WO 2014/146314 A1 9/2014

\* cited by examiner ical Field

The present invention belongs to the field of semiconductor integrated circuits, and in particular relates to a comparator circuit applicable to a high-speed pipeline ADC (Analog-to-Digital Converter).

BACKGROUND

A comparator in the form of a switch capacitor in a pipeline analog-to-digital converter is one of its key elements. Currently common comparators include a comparator with a dual-capacitor architecture and a comparator with a single-capacitor architecture. The comparator with the dual-capacitor architecture is shown in FIG. 1. In FIG. 1, corresponding switches are controlled to be turned on or off by a corresponding control signal $\varphi 1$ or $\varphi 2$ in FIG. 2, wherein the control signal $\varphi 1$ is a timing of a sampling phase and the control signal $\varphi 2$ is a timing of a setup phase. In the sampling phase, when the control signal $\varphi 1$ is at a high level, the respective switches controlled by the control signal $\varphi 1$ are turned on, input signals $V_{IP}$ and $V_{IN}$ are correspondingly collected to capacitors C1 and C3, and reference signals $V_{REF2}$ and $V_{REF1}$ are respectively collected to capacitors C2 and C4. When the control signal $\varphi 2$ reaches a rising edge, the capacitors C1 to C4 need to complete charge redistribution first, thereby obtaining a voltage difference between the corresponding input signal and the reference signal. The voltage difference is then transmitted to a pre-amplifier for amplification, and the amplified voltage difference is latched by a latch circuit to obtain an output result of the comparator. However, a residue amplifier in the pipeline ADC will not start to be set up until the control signal $\varphi 2$ is at a high level and the output result is received. That is, when the control signal $\varphi 2$ reaches the rising edge, the residue amplifier in the pipeline MDAC needs to wait for the output result of the comparator to be received before starting to be set up. This results in larger transmission delays (including a charge redistribution delay and a pre-amplifier transmission delay) of the comparator in the setup phase, thereby slowing down the conversion rate of the pipeline ADC.

In order to increase the conversion rate of the pipeline ADC, the developers proposed a comparator with a single-capacitor architecture as shown in FIG. 3. In FIG. 3, corresponding switches are controlled to be turned on or off by a corresponding control signal $\varphi 1$ or $\varphi 2$ in FIG. 4, wherein, similarly, the control signal $\varphi 1$ is a timing of a sampling phase and the control signal $\varphi 2$ is a timing of a setup phase. In the sampling phase, capacitors C1 and C2 correspondingly store reference signals $V_{REF1}$ and $V_{REF2}$ under the action of the control signal $\varphi 2$ of previous stage. Therefore, when the control signal $\varphi 1$ is at a high level and after input signals $V_{IP}$ and $V_{IN}$ are correspondingly transmitted to the capacitors C1 and C2, the capacitor C1 obtains a voltage difference between the input signal $V_{IP}$ and the reference signal $V_{REF1}$, and the capacitor C2 obtains a voltage difference between the input signal $V_{IN}$ and the reference signal $V_{REF2}$. In addition, the two voltage differences are transmitted to the pre-amplifier for amplification, and the amplified voltage differences are then transmitted to an input end of a latch. When the control signal $\varphi 1$ reaches a falling edge, the latch transmits the amplified voltage differences as an output result of the comparator to the pipeline ADC. When the control signal $\varphi 2$ reaches a rising edge, a residue amplifier in the pipeline ADC can start to be set up very quickly, while the reference signals $V_{REF1}$ and $V_{REF2}$ are correspondingly collected to the capacitors C1 and C2 again. Compared to the comparator with the dual-capacitor architecture, the comparator with the single-capacitor architecture does not have the charge redistribution delay and the pre-amplifier transmission delay, thereby increasing the transmission rate of the comparator.

The comparator with the single-capacitor architecture has a relatively higher transmission rate and can increase the conversion rate of the pipeline ADC. However, according to the comparator with the single-capacitor architecture, in the sampling phase, a sampling network from the input signals to input ends ($V_{IP}$ and $V_{LN}$, or $V_{IN}$ and $V_{LP}$) of the latch has formed a second-order system, while a sampling network of a pipeline MIDAC including only a switching resistor and a sampling capacitor belongs to a first-order system, resulting in a bandwidth mismatch problem when they are used together.

SUMMARY

The present invention provides a comparator circuit applicable to a high-speed pipeline ADC to solve a bandwidth mismatch problem that may currently occur when a capacitor with a single-capacitor architecture is used in conjunction with a pipeline ADC.

According to a first aspect of an embodiment of the present invention, there is provided a comparator circuit applicable to a high-speed pipeline ADC, comprising a switch capacitor circuit, a pre-amplification circuit and a latch circuit, wherein the pre-amplification circuit comprises a pre-amplifier, a resistance-adjustable device, a first switch and a second switch; the latch circuit comprises a differential static latch, a first capacitor, a second capacitor and a third switch; a first output end of the switch capacitor circuit is connected to an in-phase input end of the pre-amplifier, and a second output end of the switch capacitor circuit is connected to an inverting input end of the pre-amplifier; an inverting output end of the pre-amplifier is connected to a first end of the first switch; a second end of the first switch, which serves as a first output end of the pre-amplification circuit, is connected to a positive input end of the differential static latch; an in-phase output end of the pre-amplifier is connected to a first end of the second switch; a second end of the second switch, which serves as a second output end of the pre-amplification circuit, is connected to a negative input end of the differential static latch; a positive output end of the differential static latch is connected to a positive input end thereof through the first capacitor, and a negative output end of the differential static latch is connected to the negative input end thereof through the second capacitor; and the third switch is arranged between the positive output end and the negative output end of the differential static latch.

In an optional implementation manner, the switch capacitor circuit comprises fourth to tenth switches, a third capacitor, and a fourth capacitor, wherein the fourth switch and the fifth switch are connected in parallel and then connected to a first end of the third capacitor, and are configured to connect a first input signal and a first reference signal respectively; the sixth switch and the seventh switch are connected in parallel and then connected to a first end of the fourth capacitor, and are respectively configured to connect a second reference signal and a second input signal respectively; a second end of the third capacitor is connected to a power supply through the eighth switch, is connected to a second end of the fourth capacitor through the ninth switch, and serves as the first output end of the switch capacitor circuit; the second end of the fourth capacitor is connected to the power supply through the tenth switch and serves as the second output end of the switch capacitor circuit.

In another optional implementation manner, the differential static latch comprises a first MOS transistor to a sixth MOS transistor, wherein gate electrodes of the first MOS transistor and a second MOS transistor correspondingly serve as the negative input end and the positive input end of the differential static latch, and source electrodes of the first MOS transistor and the second MOS transistor are grounded respectively; in addition, a drain electrode of the first MOS transistor is connected to drain electrodes of a third MOS transistor and a fifth MOS transistor respectively; a drain electrode of the second MOS transistor is connected to drain electrodes of a fourth MOS transistor and the sixth MOS transistor respectively; source electrodes of the third MOS transistor and the fourth MOS transistor are grounded respectively and gate electrodes thereof are connected to drain electrodes of each other respectively; source electrodes of the fifth MOS transistor and the sixth MOS transistor are connected to the power supply and the gate electrodes thereof are connected to drain electrodes of each other respectively; the drain electrode of the fourth MOS transistor serves as the negative output end of the differential static latch; and the drain electrode of the third MOS transistor serves as the positive output end of the differential static latch.

In another optional implementation manner, the third switch serves as a seventh MOS transistor; a source electrode of the seventh MOS transistor is connected to the positive output end of the differential static latch, a drain electrode of the seventh MOS transistor is connected to the negative output end of the differential static latch, and a gate electrode of the seventh MOS transistor is connected to the corresponding control signal.

In yet another optional implementation manner, by reducing the size of an input tube in the pre-amplifier, a sampling network of the comparator circuit is reduced to a first-order system to match the first-order high-speed pipeline ADC.

In another optional implementation manner, a signal transmission rate of a sampling phase is adjusted by adjusting a resistance value of the resistance-adjustable device; the smaller the resistance value of the resistance-adjustable device is, and correspondingly the larger the signal transmission rate of the sampling phase is.

In another optional implementation manner, the transmission rate of the sampling phase of the comparator circuit is increased by increasing an output resistance of the latch circuit.

In another optional implementation manner, an output resistance of the latch circuit is adjusted by adjusting the amplitude of the corresponding control signal applied to the gate electrode of the seventh MOS transistor, thereby adjusting the transmission rate of the sampling phase.

In another optional implementation manner, the first switch, the second switch, the third switch, the fourth switch and the seventh switch are controlled to be turned on or off by a control signal $\varphi 1$; the fifth switch, the sixth switch, the eighth switch, the ninth switch and the tenth switch are controlled to be turned on or off by a control signal $\varphi 2$; and the control signal $\varphi 1$ and the control signal $\varphi 2$ are two-phase non-overlapping clock signals.

In another optional implementation manner, the resistance-adjustable device comprises an adjustable resistor, or an MOS transistor with an adjustable on-voltage at a gate electrode.

The present invention has the following beneficial effects:

According to the comparator circuit of the present invention, the resistance-adjustable device is additionally arranged in the pre-amplification circuit. By adjusting the resistance value of the resistance-adjustable device, the transmission rate of the sampling phase of the comparator can be adjusted on the one hand, and the amplitude of an output signal of the pre-amplifier can be clamped on the other hand, thereby reducing the kickback noise coupled to the input end. The output resistance of the latch circuit can be increased by additionally arranging the first capacitor and the second capacitor in the latch circuit and using the differential static latch as the latch in the latch circuit, thereby increasing the transmission rate of the sampling phase of the comparator circuit. The resistance value of the resistance-adjustable device of the present invention is adjustable, so the transmission rate of the sampling phase of the comparator circuit can be adjusted. In addition, when the third switch in the latch circuit serves as the seventh MOS transistor, the amplitude of the output resistance of the latch circuit is adjusted by adjusting the amplitude of the control signal on the gate electrode of the seventh MOS transistor. Therefore, the transmission rate of the sampling phase of the comparator may further be adjusted. Accordingly, it is possible for the present invention to achieve the match between the transmission rate of the comparator circuit and an operating rate of the high-speed pipeline MDAC.

DETAILED DESCRIPTION

In order to make those skilled in the art understand the technical solutions in embodiments of the present invention better and make said objects, features and advantages of the embodiments of the present invention more apparent, the technical solutions in the embodiment of the present invention will be described further in detail in conjunction with the accompanying drawings.

In the description of the present invention, unless otherwise specified and limited, it should be noted that the term "connected" needs to be broadly understood, for example, connection may be mechanical connection, electrical connection, communication of inner parts of two elements, direct connection, or indirect connection via an intermediation. Those ordinary skilled in the art can understand the specific meaning of the above terms in accordance with specific conditions.

In order to solve the problem of bandwidth mismatch between a comparator with a single-capacitor architecture and a pipeline MDAC, the comparator with the single-capacitor architecture can be designed in a reduced order. The Applicants, upon researches, have found that, by reducing the size of an input transistor in the pre-amplifier, the input transistor has a very small parasitic capacitance, such that a sampling network of a comparator circuit can be reduced to a first-order system to match a high-speed pipeline MADC of the first-order system. Although the problem of system bandwidth mismatch between the comparator and the high-speed pipeline ADC can be solved accordingly, since a load of the pipeline MADC is relatively fixed, and the size of an input transistor of the latch cannot be reduced (if it is reduced, the corresponding driver stage needs to be increased, thereby increasing the transmission delay), in the cases where the size of a pre-amplifier is limited and the load is correspondingly fixed, the transmission rate of the sampling network of the comparator with the single-capacitor architecture is relatively lower, and the pre-amplifier can only use a single-stage amplifier, accompanied with a poor insulation effect and relatively larger kickback noise. Therefore, it is also necessary to solve the problem that the transmission rate of the sampling network is reduced while the comparator with the single-capacitor architecture is designed in a reduced order.

Figure 1:
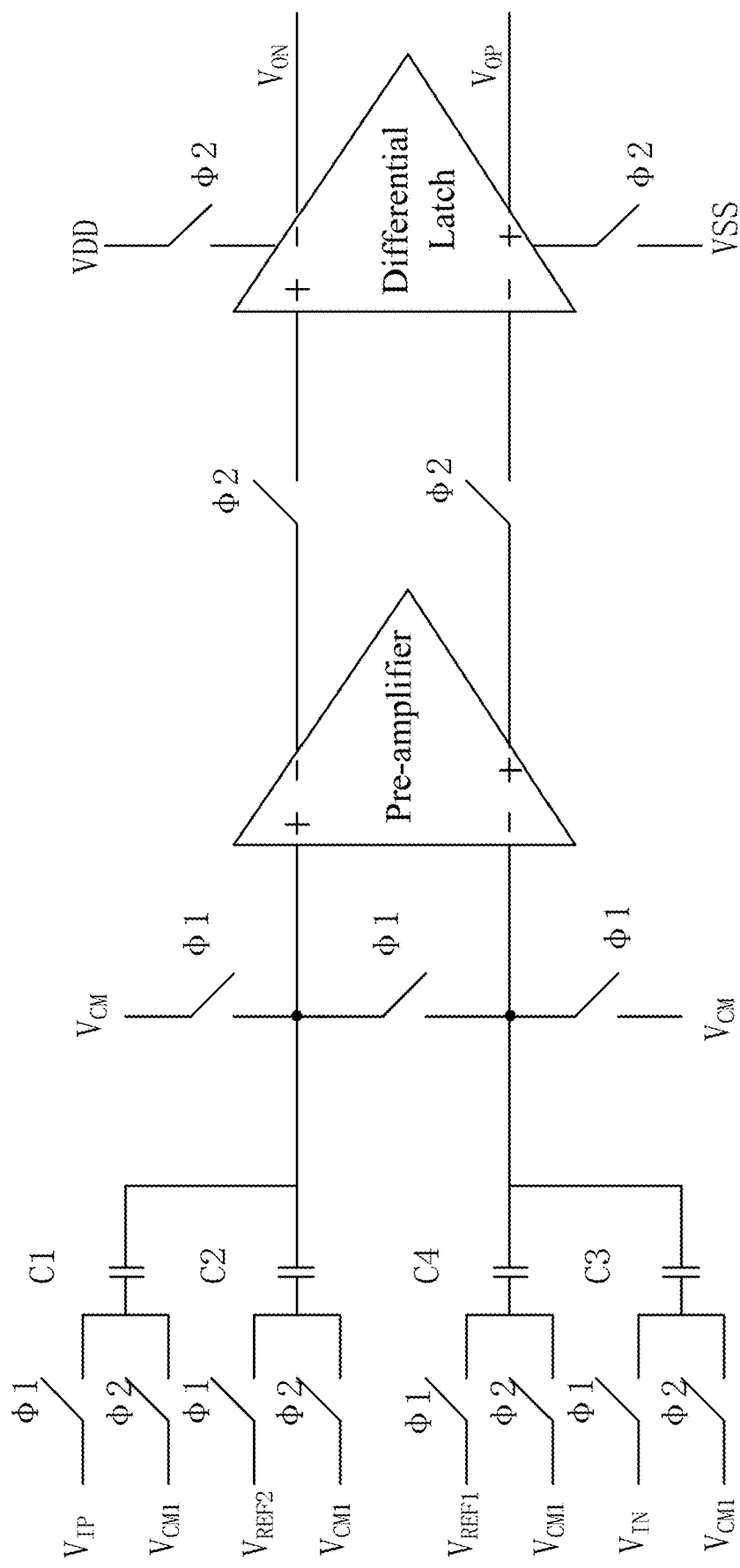
FIG. 1 is a circuit diagram of a comparator with a dual-capacitor architecture.
Figure 2:
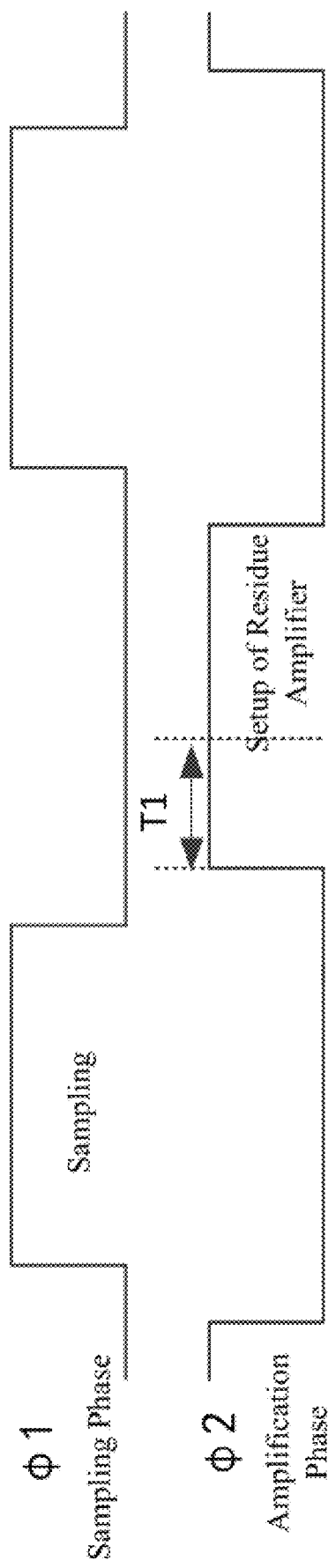
FIG. 2 is an operating timing diagram of the comparator with the dual-capacitor architecture.
Figure 3:
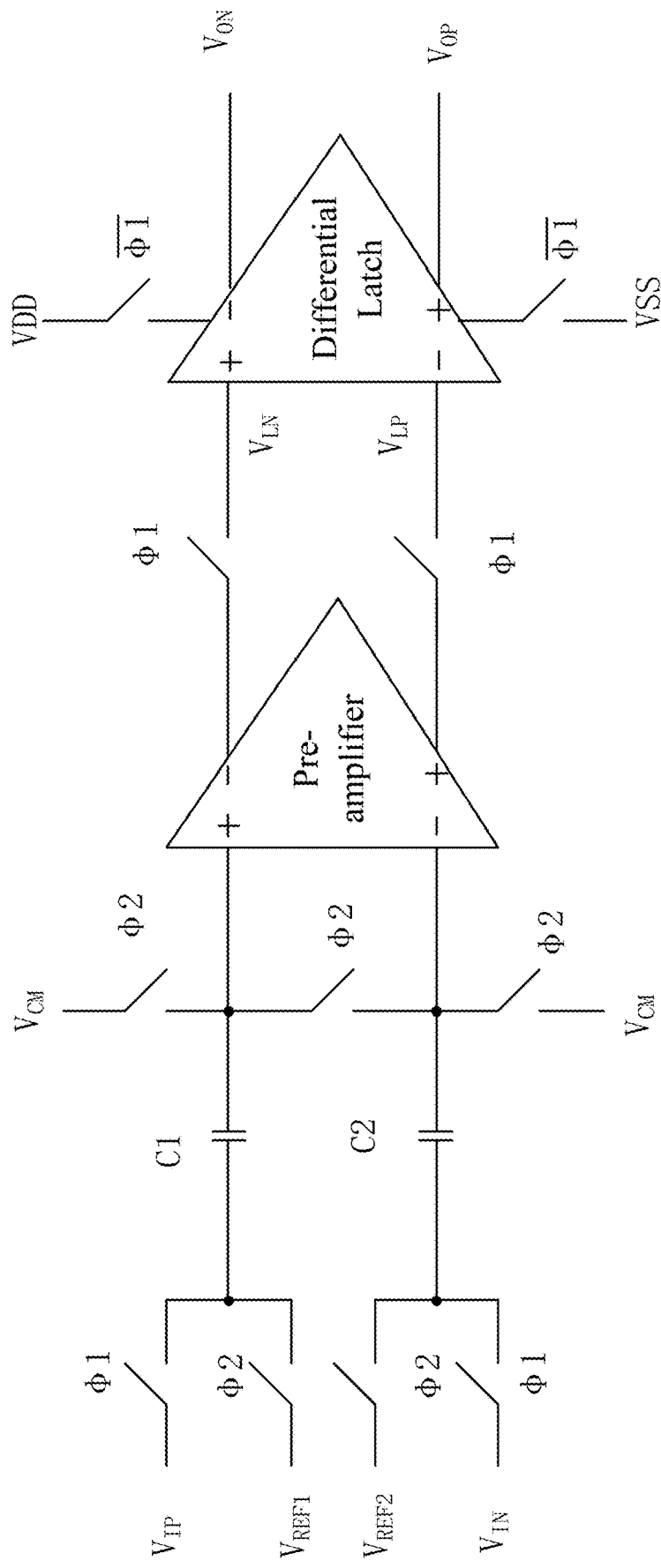
FIG. 3 is a circuit diagram of a comparator with a single-capacitor architecture.
Figure 4:
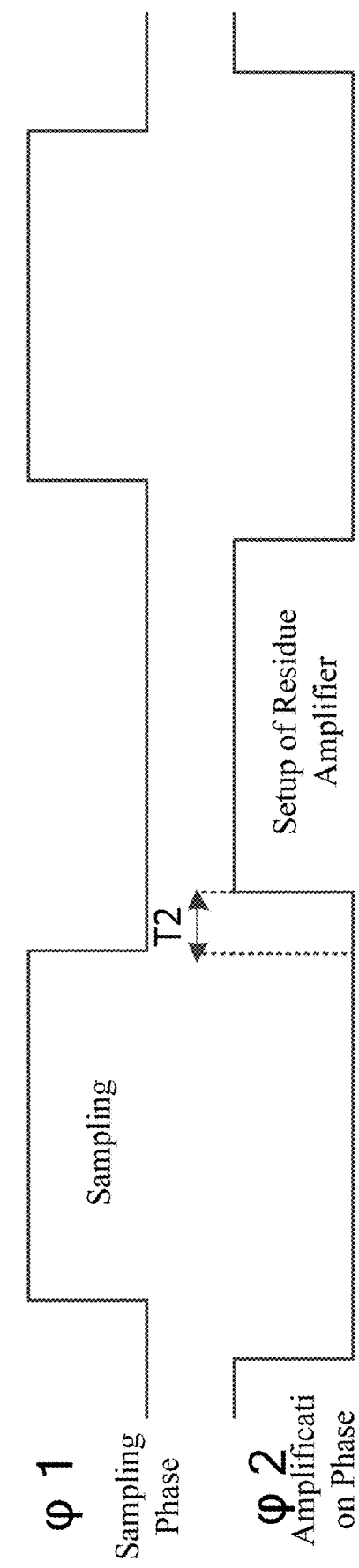
FIG. 4 is an operating timing diagram of the comparator with the single-capacitor architecture.
Figure 5:
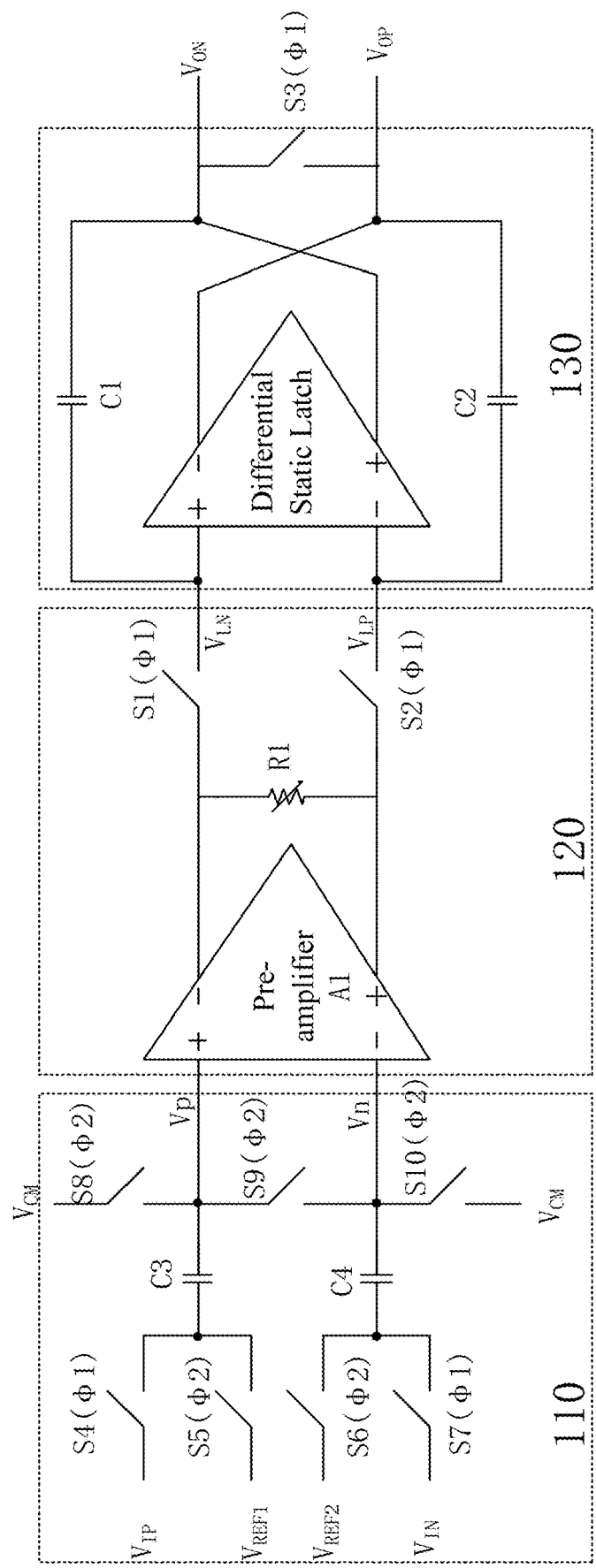
FIG. 5 is a circuit diagram of an embodiment of a comparator circuit applicable to a high-speed pipeline ADC according to the present invention.

FIG. 5 is a circuit diagram of an embodiment of a comparator circuit applicable to a high-speed pipeline ADC according to the present invention. The comparator circuit applicable to the high-speed pipeline ADC may comprise a switch capacitor circuit 110, a pre-amplifier circuit 120, and a latch circuit 130. The pre-amplifier circuit 120 may comprise a pre-amplifier A1, a resistance-adjustable device R1, a first switch S1, and a second switch S2. The latch circuit 130 may comprise a differential static latch A2, a first capacitor C1, a second capacitor C2, and a third switch S3. A first output end Vp of the switch capacitor circuit 110 is connected to an in-phase input end of the pre-amplifier A1, and a second output end Vn of the switch capacitor circuit 110 is connected to an inverting input end of the pre-amplifier A1. An inverting output end of the pre-amplifier A1 is connected to a first end of the first switch S1. A second end of the first switch S1, which serves as a first output end $V_{LN}$ of the pre-amplification circuit 120, is connected to a positive input end of the differential static latch A2. An in-phase output end of the pre-amplifier A1 is connected to a first end of the second switch S2. A second end of the second switch S2, which serves as a second output end $V_{LP}$ of the pre-amplification circuit, is connected to a negative input end of the differential static latch A2. A positive output end of the differential static latch A2 is connected to the positive input end thereof through the first capacitor C1. A negative output end of the differential static latch A2 is connected to the negative input end thereof through the second capacitor C2. In addition, the third switch S3 is arranged between the positive output end and the negative output end of the differential static latch A2. The positive output end of the differential static latch A2 serves as a first output end $V_{ON}$ of the latch circuit 130, and the negative output end of the differential static latch A2 serves as a second output end $V_{OP}$ of the latch circuit 130. The first output end $V_{ON}$ and the second output end $V_{OP}$ are connected to corresponding ends of the pipeline ADC. The resistance-adjustable device R1 may be an adjustable resistor, or an MOS having an adjustable on-voltage at a gate electrode. The on-resistance of the MOS transistor can be adjusted by adjusting the amplitude of the on-voltage of the gate electrode of the MOS (Metal-Oxide-Semiconductor Field-Effect Transistor), thereby achieving resistance value adjustment. The higher the on-voltage of the gate electrode of the MOS transistor is, and correspondingly the smaller the on-resistance of the MOS transistor is.

The switch capacitor circuit comprises a fourth switch S4 to a tenth switch S10, a third capacitor C3, and a fourth capacitor C4, wherein the fourth switch S4 and the fifth switch S5 are connected in parallel and then connected to a first end of the third capacitor C3, and are configured to connect a first input signal $V_{IP}$ and a first reference signal $V_{REF1}$ respectively. The sixth switch S6 and the seventh switch S7 are connected in parallel and then connected to a first end of the fourth capacitor C4, and are configured to connect a second reference signal $V_{REF2}$ and a second input signal $V_{IN}$ respectively. A second end of the third capacitor C3 is connected to a power supply $V_{CM}$ through the eighth switch S8, is connected to a second end of the fourth capacitor C4 through the ninth switch S9, and serves as a first output end Vp of the switch capacitor circuit 110. A second end of the fourth capacitor C4 is connected to the power supply $V_{CM}$ through the tenth switch S10 and serves as a second output end Vn of the switch capacitor circuit 110.

Figure 6:
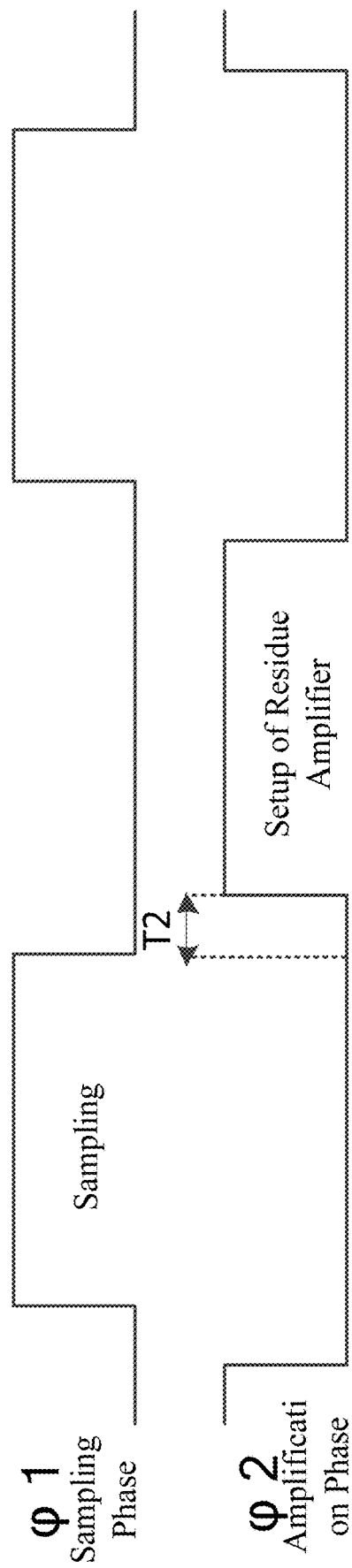
FIG. 6 is a circuit diagram of an embodiment of a latch circuit in FIG. 5.

In addition, as shown in FIG. 6, the differential static latch A2 may comprise a first MOS transistor M1 to a sixth MOS transistor M6, wherein gate electrodes of the first MOS transistor M1 and the second MOS transistor M2 correspondingly serve as the negative input end and the positive input end (which are correspondingly connected to the second output end $V_{LP}$ and the first output end $V_{LN}$ of the pre-amplification circuit 120) of the differential static latch A1, and source electrodes of the first MOS transistor M1 and the second MOS transistor M2 are grounded respectively. In addition, a drain electrode of the first MOS transistor M1 is connected to drain electrodes of the third MOS transistor M3 and the fifth MOS transistor M5 respectively. A drain electrode of the second MOS transistor M2 is connected to drain electrodes of the fourth MOS transistor M4 and the sixth MOS transistor M6 respectively. Source electrodes of the third MOS transistor M3 and the fourth MOS transistor M4 are grounded respectively and gate electrodes thereof are connected to drain electrodes of each other respectively. Source electrodes of the fifth MOS transistor M5 and the sixth MOS transistor M6 are connected to the power supply $V_{CM}$ and the gate electrodes thereof are connected to drain electrodes of each other. The drain electrode of the fourth MOS transistor M4 serves as the negative output end (corresponding to the second output end $V_{OP}$ of the latch circuit 130) of the differential static latch A2. The drain electrode of the third MOS transistor M3 serves as the positive output end (corresponding to the first output end $V_{ON}$ of the latch circuit 130) of the differential static latch A2. In the present embodiment, the third switch S3 may serve as a seventh MOS transistor M7 in FIG. 6. A source electrode of the seventh MOS transistor M7 is connected to the positive output end of the differential static latch, a drain electrode of the seventh MOS transistor M7 is connected to the negative output end of the differential static latch, and the gate electrode of the seventh MOS transistor M7 is connected to the corresponding control signal φ1.

Figure 7:
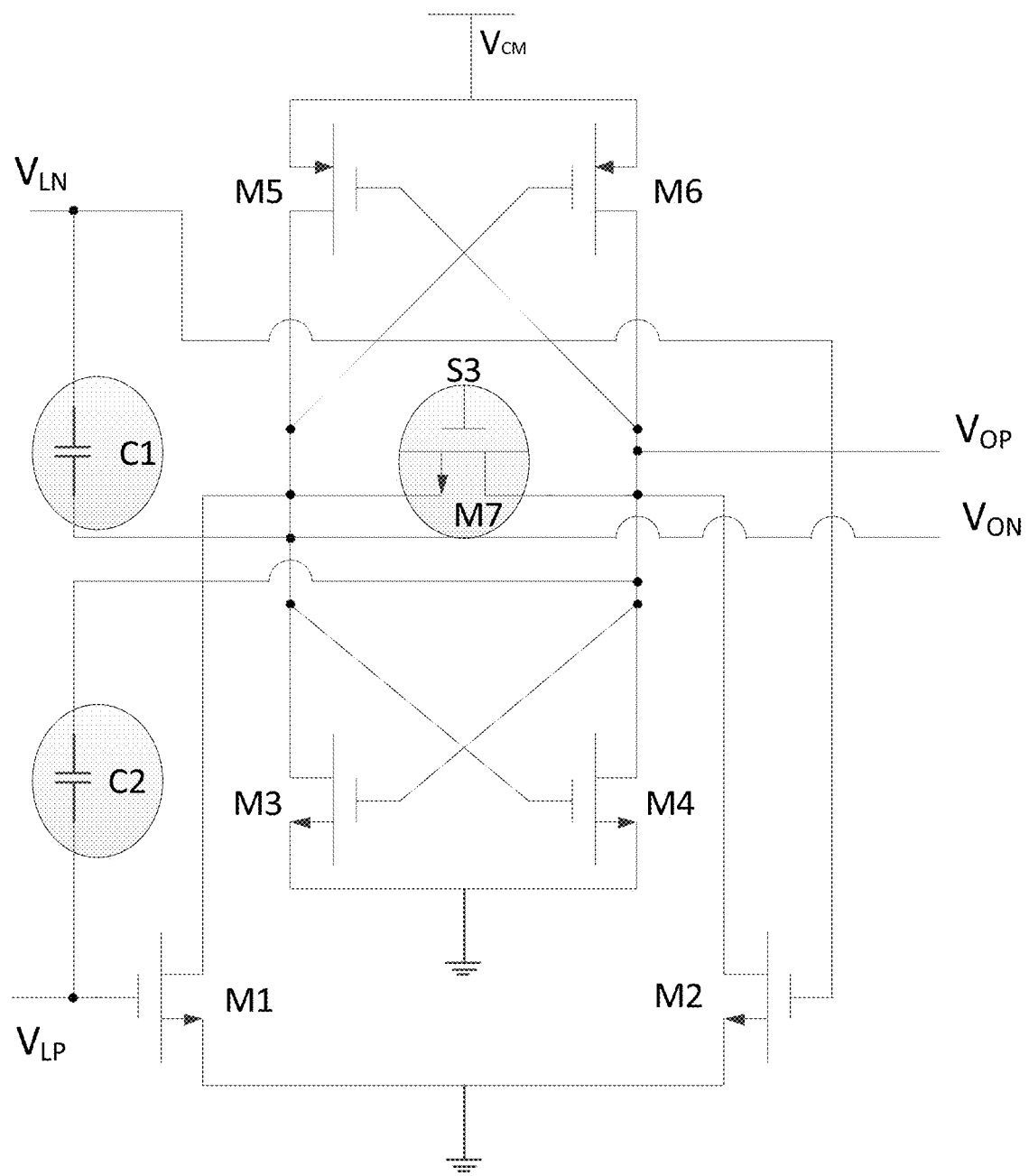
FIG. 7 is an operating timing diagram of the comparator circuit applicable to the high-speed pipeline ADC according to the present invention.

As shown in FIG. 5, the first switch S1, the second switch S2, the third switch S3, the fourth switch S4 and the seventh switch S7 are controlled to be turned on or off by a control signal φ1. The fifth switch S5, the sixth switch S6, the eighth switch S8, the ninth switch S9 and the tenth switch S10 are controlled to be turned on or off by a control signal φ2. The control signal φ1 and the control signal φ2 are two-phase non-overlapping clock signals, and the operating timing diagrams of the control signal φ1 and the control signal φ2 are as shown in FIG. 7. The control signal φ1 is a timing of a sampling phase and the control signal φ2 is a timing of a setup phase. In the sampling phase, the third capacitor C3 and the fourth capacitor C4 correspondingly store reference signals $V_{REF1}$ and $V_{REF2}$ under the action of the control signal φ2 of previous stage. Therefore, when the control signal φ1 is at a high level and after input signals $V_{IP}$ and $V_{IN}$ are correspondingly transmitted to the capacitors C1 and C2, the capacitor C1 obtains a voltage difference between the input signal $V_{IP}$ and the reference signal $V_{REF1}$, and the capacitor C2 obtains a voltage difference between the input signal $V_{IN}$ and the reference signal $V_{REF2}$. In addition, the two voltage differences are transmitted to the pre-amplifier for amplification, and the amplified voltage differences are then transmitted to an input end of the latch. When the control signal φ1 reaches a falling edge, the latch transmits the amplified voltage differences as an output result of the comparator to the pipeline ADC. When the control signal φ2 reaches a rising edge, a residue amplifier in the pipeline ADC can start to be set up, while the reference signals $V_{REF1}$ and $V_{REF2}$ are correspondingly collected to the capacitors C1 and C2 again.

According to the comparator circuit, the resistance-adjustable device is additionally arranged in the pre-amplification circuit. By adjusting the resistance value of the resistance-adjustable device, the transmission rate (i.e., the transmission rate of the sampling phase) of the pre-amplification circuit can be adjusted on the one hand, and the amplitude of an output signal of the pre-amplifier can be clamped on the other hand, thereby reducing the kickback noise coupled to the input end. The smaller the resistance value of the resistance-adjustable device is, and correspondingly the larger the signal transmission rate of the sampling phase is.

Figure 8:
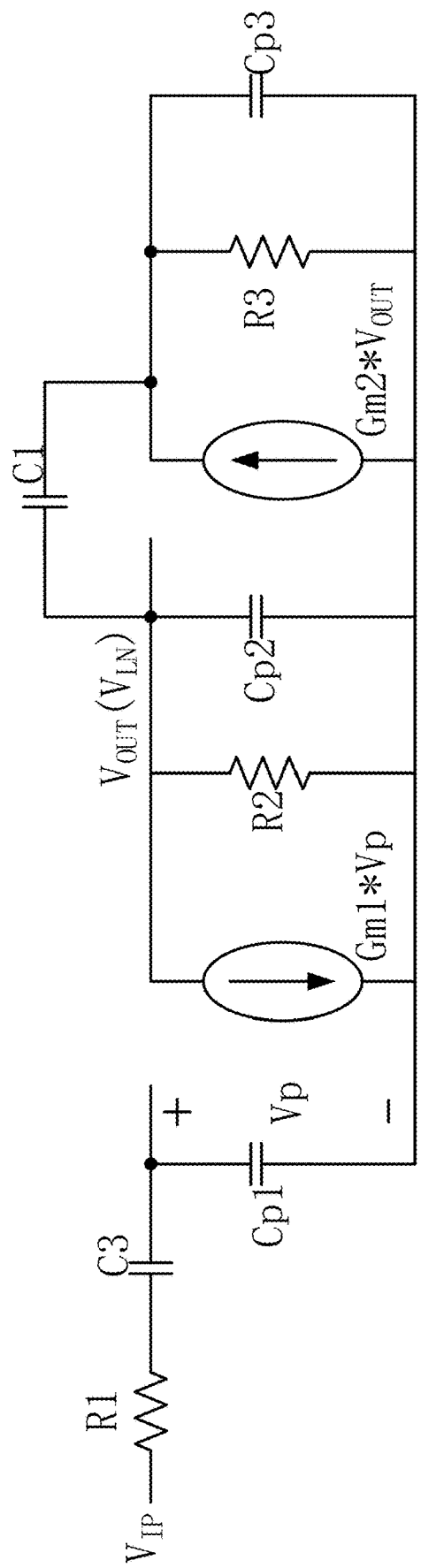
FIG. 8 is a single-ended small-signal equivalent circuit diagram according to the present invention.
Figure 9:
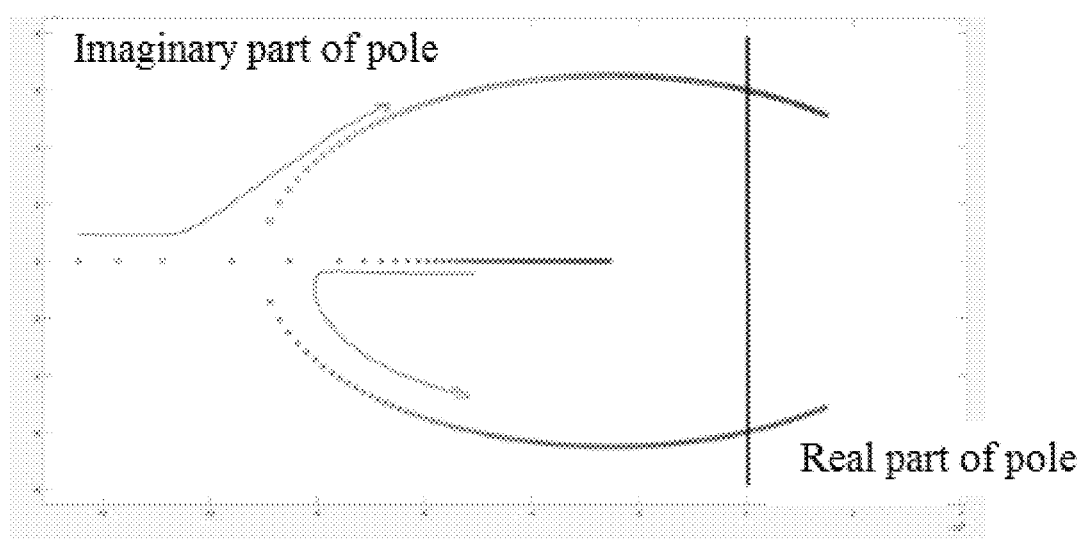
FIG. 9 is a schematic view showing a change trend of a pole over a positive feedback strength according to the present invention.

The first capacitor C1 and the second capacitor C2 which are configured for positive feedback are additionally arranged in the latch circuit. The positive feedback can adjust a zero-pole of a sampling circuit. As the feedback strength increases, a real pole can be modulated into a complex pole. However, the positive feedback strength is determined by small-signal gains of the first capacitor C1 and the second capacitor C2. Therefore, the latch in the latch circuit must be a static latch to ensure that a certain gain can also be provided in the sampling phase. A single-ended small-signal model of the latch is as shown in FIG. 8. A small-signal gain of the latch determines the feedback strength. A change curve of a pole over the output resistance of the latch circuit is as shown in FIG. 9 (the arrow direction indicates a direction in which the output resistance increases). When the output resistance is relatively small and the feedback gain is very low, two real poles which are far apart are obtained. As the output resistance increases, the poles gradually approach each other and become two complex poles which move towards the right half plane. As the complex poles move towards the right half plane, the damping coefficient becomes smaller and smaller, which causes the phase change on the phase frequency response to become slower and slower. Correspondingly, in the time domain, the transmission delay will be smaller, thereby achieving the effect of high-speed transmission. When the third switch S3 is the seventh MOS transistor M7, the on-resistance of the seventh MOS transistor can be adjusted by adjusting the amplitude of the control signal φ1 applied to the gate electrode of the seventh MOS transistor, thereby adjusting the output resistance of the latch circuit and thus adjusting the transmission rate of the sampling phase of the comparator circuit.

As can be seen from the above embodiments, the resistance-adjustable device is additionally arranged in the pre-amplification circuit. By adjusting the resistance value of the resistance-adjustable device, the transmission rate of the sampling phase of the comparator can be adjusted on the one hand, and the amplitude of the output signal of the pre-amplifier can be clamped on the other hand, thereby reducing the kickback noise coupled to the input end. The output resistance of the latch circuit can be increased by additionally arranging the first capacitor and the second capacitor in the latch circuit and using the differential static latch as the latch in the latch circuit, thereby increasing the transmission rate of the sampling phase of the comparator circuit. The resistance value of the resistance-adjustable device of the present invention is adjustable, so the transmission rate of the sampling phase of the comparator circuit can be adjusted. In addition, when the third switch in the latch circuit serves as the seventh MOS transistor, the amplitude of the output resistance of the latch circuit is adjusted by adjusting the amplitude of the control signal at the gate electrode of the seventh MOS transistor. Therefore, the transmission rate of the sampling phase of the comparator may further adjusted. Accordingly, it is possible for the present invention to achieve the match between the transmission rate of the comparator circuit and an operating rate of the high-speed pipeline MDAC.

Upon consideration of the description and practice of the present invention disclosed herein, other embodiments of the present invention will be readily apparent to those skilled in the art. The present application is intended to cover any variations, uses, or adaptations of the present invention, which conform to general principles of the present invention and include the common sense or conventional technical means in the art that is not disclosed in the present invention. The description and embodiments are merely considered as exemplary. The true scope and spirit of the present invention are indicated by the following claims.

It should be understood that the present invention is not limited to the above-described precise structures shown in the drawings, and various modifications and changes can be made without departing from the scope thereof. The scope of the present invention is limited only by appended claims.

What is claimed is:

1. A comparator circuit applicable to a high-speed pipeline ADC (Analog-to-Digital Converter), comprising a switch capacitor circuit, a pre-amplification circuit and a latch circuit, wherein the pre-amplification circuit comprises a pre-amplifier, a resistance-adjustable device, a first switch and a second switch; the latch circuit comprises a differential static latch, a first capacitor, a second capacitor and a third switch; a first output end of the switch capacitor circuit is connected to an in-phase input end of the pre-amplifier, and a second output end of the switch capacitor circuit is connected to an inverting input end of the pre-amplifier; an inverting output end of the pre-amplifier is connected to a first end of the first switch; a second end of the first switch, which serves as a first output end of the pre-amplification circuit, is connected to a positive input end of the differential static latch; an in-phase output end of the pre-amplifier is connected to a first end of the second switch; a second end of the second switch, which serves as a second output end of the pre-amplification circuit, is connected to a negative input end of the differential static latch; a positive output end of the differential static latch is connected to the positive input end thereof through the first capacitor, and a negative output end of the differential static latch is connected to the negative input end thereof through the second capacitor; and the third switch is arranged between the positive output end and the negative output end of the differential static latch.

2. The comparator circuit applicable to the high-speed pipeline ADC according to claim 1, wherein the switch capacitor circuit comprises fourth to tenth switches, a third capacitor, and a fourth capacitor, wherein the fourth switch and the fifth switch are connected in parallel and then connected to a first end of the third capacitor, and are configured to connect a first input signal and a first reference signal respectively; the sixth switch and the seventh switch are connected in parallel and then connected to a first end of the fourth capacitor, and are configured to connect a second reference signal and a second input signal respectively; a second end of the third capacitor is connected to a power supply through the eighth switch, is connected to a second end of the fourth capacitor through the ninth switch, and serves as the first output end of the switch capacitor circuit; the second end of the fourth capacitor is connected to the power supply through the tenth switch and serves as the second output end of the switch capacitor circuit.

3. The comparator circuit applicable to the high-speed pipeline ADC according to claim 2, wherein the first switch, the second switch, the third switch, the fourth switch and the seventh switch are controlled to be turned on or off by a control signal $\varphi 1$; the fifth switch, the sixth switch, the eighth switch, the ninth switch and the tenth switch are controlled to be turned on or off by a control signal $\varphi 2$; and the control signal $\varphi 1$ and the control signal $\varphi 2$ are two-phase non-overlapping clock signals.

4. The comparator circuit applicable to the high-speed pipeline ADC according to claim 1, wherein the differential static latch comprises a first MOS transistor to a sixth MOS transistor, wherein gate electrodes of the first MOS transistor and a second MOS transistor correspondingly serve as the negative input end and the positive input end of the differential static latch, and source electrodes of the first MOS transistor and the second MOS transistor are grounded respectively; in addition, a drain electrode of the first MOS transistor is connected to drain electrodes of a third MOS transistor and a fifth MOS transistor respectively; a drain electrode of the second MOS transistor is connected to drain electrodes of a fourth MOS transistor and the sixth MOS transistor respectively; source electrodes of the third MOS transistor and the fourth MOS transistor are grounded respectively and gate electrodes thereof are connected to drain electrodes of each other respectively; source electrodes of the fifth MOS transistor and the sixth MOS transistor are connected to the power supply and the gate electrodes thereof are connected to drain electrodes of each other respectively; the drain electrode of the fourth MOS transistor serves as the negative output end of the differential static latch; and the drain electrode of the third MOS transistor serves as the positive output end of the differential static latch.

5. The comparator circuit applicable to the high-speed pipeline ADC according to claim 4, wherein the first switch, the second switch, the third switch, the fourth switch and the seventh switch are controlled to be turned on or off by a control signal $\varphi 1$; the fifth switch, the sixth switch, the eighth switch, the ninth switch and the tenth switch are controlled to be turned on or off by a control signal $\varphi 2$; and the control signal $\varphi 1$ and the control signal $\varphi 2$ are two-phase non-overlapping clock signals.

6. The comparator circuit applicable to the high-speed pipeline ADC according to claim 1, wherein the third switch serves as a seventh MOS transistor; a source electrode of the seventh MOS transistor is connected to the positive output end of the differential static latch, a drain electrode of the seventh MOS transistor is connected to the negative output end of the differential static latch, and a gate electrode of the seventh MOS transistor is connected to the corresponding control signal.

7. The comparator circuit applicable to the high-speed pipeline ADC according to claim 6, wherein an output resistance of the latch circuit is adjusted by adjusting the amplitude of the corresponding control signal applied to the gate electrode of the seventh MOS transistor, thereby adjusting the transmission rate of the sampling phase.

8. The comparator circuit applicable to the high-speed pipeline ADC according to claim 7, wherein the first switch, the second switch, the third switch, the fourth switch and the seventh switch are controlled to be turned on or off by a control signal $\varphi 1$; the fifth switch, the sixth switch, the eighth switch, the ninth switch and the tenth switch are controlled to be turned on or off by a control signal $\varphi 2$; and the control signal $\varphi 1$ and the control signal $\varphi 2$ are two-phase non-overlapping clock signals.

9. The comparator circuit applicable to the high-speed pipeline ADC according to claim 6, wherein the first switch, the second switch, the third switch, the fourth switch and the seventh switch are controlled to be turned on or off by a control signal $\varphi 1$; the fifth switch, the sixth switch, the eighth switch, the ninth switch and the tenth switch are controlled to be turned on or off by a control signal $\varphi 2$; and the control signal $\varphi 1$ and the control signal $\varphi 2$ are two-phase non-overlapping clock signals.

10. The comparator circuit applicable to the high-speed pipeline ADC according to claim 1, wherein, by reducing the size of an input tube in the pre-amplifier, a sampling network of the comparator circuit is reduced to a first-order system to match a first-order sampling network of the high-speed pipeline MDAC.

11. The comparator circuit applicable to the high-speed pipeline ADC according to claim 10, wherein a signal transmission rate of a sampling phase is adjusted by adjusting a resistance value of the resistance-adjustable device; the smaller the resistance value of the resistance-adjustable device is, and correspondingly the larger the signal transmission rate of the sampling phase is.

12. The comparator circuit applicable to the high-speed pipeline ADC according to claim 11, wherein the first switch, the second switch, the third switch, the fourth switch and the seventh switch are controlled to be turned on or off by a control signal $\varphi 1$; the fifth switch, the sixth switch, the eighth switch, the ninth switch and the tenth switch are controlled to be turned on or off by a control signal $\varphi 2$; and the control signal φ1 and the control signal φ2 are two-phase non-overlapping clock signals.

13. The comparator circuit applicable to the high-speed pipeline ADC according to claim 10, wherein the first switch, the second switch, the third switch, the fourth switch and the seventh switch are controlled to be turned on or off by a control signal φ1; the fifth switch, the sixth switch, the eighth switch, the ninth switch and the tenth switch are controlled to be turned on or off by a control signal φ2; and the control signal φ1 and the control signal φ2 are two-phase non-overlapping clock signals.

14. The comparator circuit applicable to the high-speed pipeline ADC according to claim 1, wherein the transmission rate of the sampling phase of the comparator circuit is increased by increasing an output resistance of the latch circuit.

15. The comparator circuit applicable to the high-speed pipeline ADC according to claim 14, wherein the first switch, the second switch, the third switch, the fourth switch and the seventh switch are controlled to be turned on or off by a control signal φ1; the fifth switch, the sixth switch, the eighth switch, the ninth switch and the tenth switch are controlled to be turned on or off by a control signal φ2; and the control signal φ1 and the control signal φ2 are two-phase non-overlapping clock signals.

16. The comparator circuit applicable to the high-speed pipeline ADC according to claim 1, wherein the resistance-adjustable device comprises an adjustable resistor, or an MOS transistor with an adjustable on-voltage at a gate electrode.

\* \* \* \* \*